US012813326B2

(12) United States Patent
Takeya et al.

(10) Patent No.: US 12,813,326 B2
(45) Date of Patent: Nov. 24, 2026

(54) SEALING MATERIAL FOR COMPOUNDS HAVING NON-STOICHIOMETRIC COMPOSITION AND METHOD FOR MANUFACTURING SAME

(71) Applicants: THE UNIVERSITY OF TOKYO, Tokyo (JP); DAICEL CORPORATION, Osaka (JP)

(72) Inventors: Junichi Takeya, Tokyo (JP); Shunichiro Watanabe, Tokyo (JP); Shouhei Kumagai, Tokyo (JP); Xiaozhu Wei, Tokyo (JP); Daiji Ikeda, Tokyo (JP); Hiroki Sato, Tokyo (JP); Yasuyuki Akai, Tokyo (JP)

(73) Assignees: THE UNIVERSITY OF TOKYO, Tokyo (JP); DAICEL CORPORATION, Osaka (JP)

( * ) Notice: Subject to any disclaimer, the term of this patent is extended or adjusted under 35 U.S.C. 154(b) by 468 days.

(21) Appl. No.: 18/277,129

(22) PCT Filed: Feb. 24, 2022

(86) PCT No.: PCT/JP2022/007657
§ 371 (c)(1),
(2) Date: Aug. 14, 2023

(87) PCT Pub. No.: WO2022/181706
PCT Pub. Date: Sep. 1, 2022

(65) Prior Publication Data

US 2024/0128144 A1 Apr. 18, 2024

(30) Foreign Application Priority Data

Feb. 25, 2021 (JP) ................................ 2021-029328

(51) Int. Cl.
*H10W 74/10* (2026.01)
*B05D 1/00* (2006.01)
(Continued)

(52) U.S. Cl.
CPC ............ *H10W 74/147* (2026.01); *B05D 1/60* (2013.01); *C23C 16/403* (2013.01);
(Continued)

(58) Field of Classification Search
None
See application file for complete search history.

(56) References Cited

U.S. PATENT DOCUMENTS

2008/0185173 A1* 8/2008 Bedinger .............. H05K 3/284 29/841
2010/0090218 A1 4/2010 Tsukahara
(Continued)

FOREIGN PATENT DOCUMENTS

CN 101728339 A 6/2010
JP 2010-93172 A 4/2010
(Continued)

OTHER PUBLICATIONS

Lee et al., "Hybrid Thin-Film Encapsulation for All-Solid-State Thin-Film Batteries," ACS Applied Materials & Interfaces, vol. 12, 2020, pp. 11504-11510.
(Continued)

*Primary Examiner* — Ramsey Zacharia
(74) *Attorney, Agent, or Firm* — Birch, Stewart, Kolasch & Birch, LLP

(57) ABSTRACT

The present disclosure provides a sealing material suitable for a compound having a non-stoichiometric composi263tion. The present disclosure is related to a sealing material for a compound having a non-stoichiometric composition, the sealing material including a polymer layer
(Continued)

and an inorganic oxide insulator layer, wherein the polymer layer includes a first polymer layer containing an organic solvent soluble polymer.

12 Claims, 23 Drawing Sheets

(51) Int. Cl.

| | |
|---|---|
| ***C23C 16/40*** | (2006.01) |
| ***C23C 16/455*** | (2006.01) |
| ***H10W 74/01*** | (2026.01) |
| ***H10W 74/43*** | (2026.01) |
| ***H10W 74/47*** | (2026.01) |

(52) U.S. Cl.

CPC ....... *C23C 16/45525* (2013.01); *H10W 74/01* (2026.01); *H10W 74/137* (2026.01); *H10W 74/43* (2026.01); *H10W 74/47* (2026.01); *B05D 2507/00* (2013.01)

(56) References Cited

U.S. PATENT DOCUMENTS

| | | | |
|---|---|---|---|
| 2011/0062436 | A1 | 3/2011 | Yamazaki et al. |
| 2011/0260147 | A1 | 10/2011 | Kim et al. |
| 2017/0271518 | A1 | 9/2017 | Ushikura et al. |
| 2021/0183647 | A1 * | 6/2021 | Hanft .................. H10P 14/6548 |

FOREIGN PATENT DOCUMENTS

| | | | |
|---|---|---|---|
| JP | 2011-86923 | A | 4/2011 |
| KR | 10-1688739 | B1 | 12/2016 |
| TW | 201207997 | A1 | 2/2012 |

OTHER PUBLICATIONS

International Search Report (PCT/ISA/210) issued in PCT/JP2022/007657 mailed on May 10, 2022.

Written Opinion (PCT/ISA/237) issued in PCT/JP2022/007657 mailed on May 10, 2022.

Zhan et al., "Hybrid Passivation for Foldable Indium Gallium Zinc Oxide Thin-Film Transistors Mediated by Low-Temperature and Low-Damage Parylene-C/Atomic Layer Deposition-AlOx Coating", Phys. Status Solidi, 2020, vol. 217, No. 1900832, pp. 1-8.

* cited by examiner

SEALING MATERIAL FOR COMPOUNDS HAVING NON-STOICHIOMETRIC COMPOSITION AND METHOD FOR MANUFACTURING SAME

TECHNICAL FIELD

The present invention relates to a sealing material for a compound having a non-stoichiometric composition and a method for manufacturing the same.

BACKGROUND ART

Semiconductor devices are expected to be basic elements of electronic devices in the Internet of Things (IoT) society. In particular, an amorphous metal oxide semiconductor (AOS) is a promising candidate for printed electronics.

The AOS has characteristics such as high mobility, low voltage driving, high affinity with a gate insulating film, transparency, and high thermal stability, and is expected to be applied to next-generation devices such as transparent flexible TFTs and electronic paper.

The use of printed electronics is a promising solution because of its high throughput. In particular, a thin film transistor (TFT) using a printable semiconductor has attracted attention as a key device for developing trillions of sensors and radio frequency identification tags and realizing information exchange between different objects. Among printable materials, the amorphous metal oxide semiconductor (AOS) having high carrier mobility and excellent uniformity is regarded as a promising printing material for the TFT.

However, since the AOS has high sensitivity to the environment such as molecules present in ambient including oxygen and water, and is unstable in mobility, a threshold voltage, bias stress, and the like, there are problems in that the AOS is deteriorated due to a manufacturing process and has a difficulty in performing a practical long-term stable operation. Therefore, a sealing material (passivation) that suppresses the influence of ambient molecules including oxygen and water on the AOS is used, and thus the AOS is protected.

Insulating inorganic oxide sealing materials such as SiOx, SiOx/SiNx, AlOx, YOx, and the like exhibit low gas permeability and water permeability. However, when a film forming process such as an atomic layer deposition method (ALD) method or a sputtering method is used to form such an inorganic oxide sealing material, the AOS may be damaged and the performance of the TFT may be deteriorated.

Alternatively, an insulating polymer formed into a film by chemical vapor deposition (CVD), such as CYTOP (trade name) or parylene, is also used as the sealing material (Patent Document 1). Since these films are formed by a film forming process by CVD, which is relatively mild, damage to the AOS is relatively small. However, such a polymer has a higher permeability of gas and water than that of the inorganic oxide, and thus does not have sufficient protection performance.

Therefore, a sealing material having a two layer structure obtained by combining the materials of the above-mentioned sealing materials has been proposed. Non-Patent Literature 1 proposes a technique of forming a parylene layer, which is an organic substance, and then laminating AlOx, which is an inorganic oxide insulator layer, by using the ALD method to perform sealing.

CITATION LIST

Non-Patent Literature

Non-Patent Literature 1: S. Zhan et al., Phys. Status Solidus, 2020, 217, 1900832.

SUMMARY OF INVENTION

Technical Problem

It has been found that these known sealing materials can be used for the amorphous metal oxide semiconductor (AOS) formed by a vacuum process, but when used for an AOS formed by printable solution process, the AOS is damaged. As a cause of this, it has been found that the AOS formed by the solution process has a non-stoichiometric composition in which oxygen or the like is deficient and thus has very high environmental sensitivity and is easily damaged by a known forming process of the sealing material.

Therefore, a sealing technique suitable for a compound having a non-stoichiometric composition is required.

Solution to Problem

The gist of an embodiment of the present invention is as follows.

(1) A sealing material for a compound having a non-stoichiometric composition, the sealing material including a polymer layer, and an inorganic oxide insulator layer, wherein the polymer layer includes a first polymer layer containing an organic solvent soluble polymer.

(2) The sealing material according to above (1), wherein the polymer layer further includes a second polymer layer located between the first polymer layer and the inorganic oxide insulator layer, and the second polymer layer includes a chemical vapor deposition film.

(3) The sealing material according to above (2), wherein a total thickness of the first polymer layer, the second polymer layer, and the inorganic oxide insulator layer is 100 nm or less.

(4) The sealing material according to any one of above (1) to (3), wherein the organic solvent soluble polymer is an acrylic polymer, a styrenic polymer, a fluorine-based polymer, a thermally crosslinkable polymer, or a combination thereof.

(5) The sealing material according to any one of above (1) to (4), wherein an inorganic oxide insulator of the inorganic oxide insulator layer is AlOx, HfOx, ZrOx, SiOx, TiOx, or a combination thereof.

(6) The sealing material according to any one of above (2) to (5), wherein the chemical vapor deposition film is parylene.

(7) The sealing material according to any one of above (1) to (6), wherein the compound having a non-stoichiometric composition is an amorphous metal oxide inorganic semiconductor film.

(8) The sealing material according to above (7), wherein the amorphous metal oxide inorganic semiconductor film has different distribution of oxygen deficiency state in a direction perpendicular to a main surface of the film, and includes a surface and an inside, the surface including more oxygen deficiency than the inside.

(9) An electronic element including the sealing material described in any one of above (1) to (8).

(10) A method for manufacturing a sealing material for a compound having a non-stoichiometric composition, the method including providing a substrate, preparing an organic solvent containing a first polymer dissolved, forming a polymer layer including a first polymer layer on the substrate by applying an organic solvent containing the first polymer dissolved, and forming an inorganic oxide insulator layer on the polymer layer by using an atomic layer deposition method or a sputtering method to obtain a sealing material.

(11) The method for manufacturing a sealing material according to above (10), wherein the forming the polymer layer includes forming a second polymer layer which is a chemical vapor deposition film on the first polymer layer by using a chemical vapor deposition method, and the forming the inorganic oxide insulator layer includes forming the inorganic oxide insulator layer on the second polymer layer.

Advantageous Effects of Invention

According to the present invention, a sealing material suitable for a compound having a non-stoichiometric composition can be provided.

DESCRIPTION OF EMBODIMENTS

The present disclosure is directed to a sealing material for a compound having a non-stoichiometric composition, the sealing material including a polymer layer and an inorganic oxide insulator layer, in which the polymer layer includes a first polymer layer containing an organic solvent soluble polymer.

According to a sealing material of the present disclosure, damage to a compound having a non-stoichiometric composition can be suppressed even under air atmosphere in which moisture or oxygen is present. Therefore, according to the sealing material of the present disclosure, an electronic device containing the compound having a non-stoichiometric composition can be stably operated under air atmosphere for a long time.

According to the sealing material of the present disclosure, a damage to the compound having a non-stoichiometric composition due to a step of disposing the sealing material and a subsequent step of fabricating an electronic element or an electronic device can also be suppressed. For example, even when another electronic element or electronic device is laminated and integrated on the sealing material by a lithography process using water or an organic solvent after the sealing material is formed, deterioration of the compound having a non-stoichiometric composition can be suppressed. Therefore, according to the sealing material of the present disclosure, a complicated integrated device including the compound having a non-stoichiometric composition, for example, a complementary metal oxide semiconductor or an inorganic/organic hybrid semiconductor can be fabricated. The sealing material of the present disclosure can provide convenient and effective sealing, particularly in the printed electronics.

Figure 1:
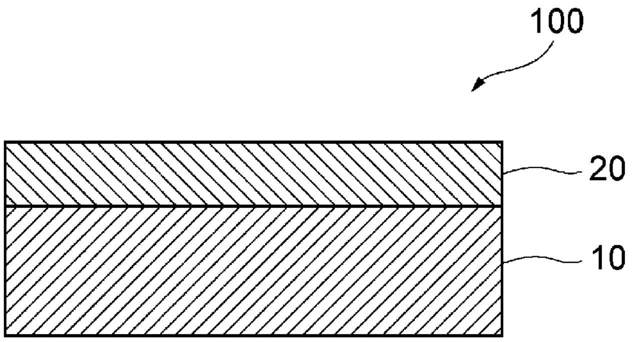
FIG. 1 is a schematic cross-sectional view of a sealing material of the present disclosure.

FIG. 1 illustrates a schematic cross-sectional view of a sealing material 100 of the present disclosure. The sealing material 100 includes a polymer layer 10 and an inorganic oxide insulator layer 20. The polymer layer 10 includes a first polymer layer containing an organic solvent soluble polymer. The polymer layer 10 may be composed of only the first polymer layer. The first polymer layer preferably contains the organic solvent soluble polymer. The organic solvent soluble polymer means a polymer which is soluble in an organic solvent and examples thereof includes those that are polymers or oligomers when dissolved in the organic solvent. The organic solvent is a solvent which can dissolve the organic solvent soluble polymer but does not dissolve the compound having a non-stoichiometric composition, and examples thereof include butyl acetate, toluene, xylene, and acetonitrile.

The first polymer layer containing the organic solvent soluble polymer can be formed by a mild method such as solution process. Since the solution process does not use vacuum or radical reaction, further formation of oxygen defects due to desorption of oxygen can be avoided, and there is an advantage of very low or no reactivity with the compound having a non-stoichiometric composition. In the solution process, there is also no reaction in which acid is generated. Therefore, the first polymer layer can be formed directly on the compound having a non-stoichiometric composition without substantially damaging the compound.

Figure 2:
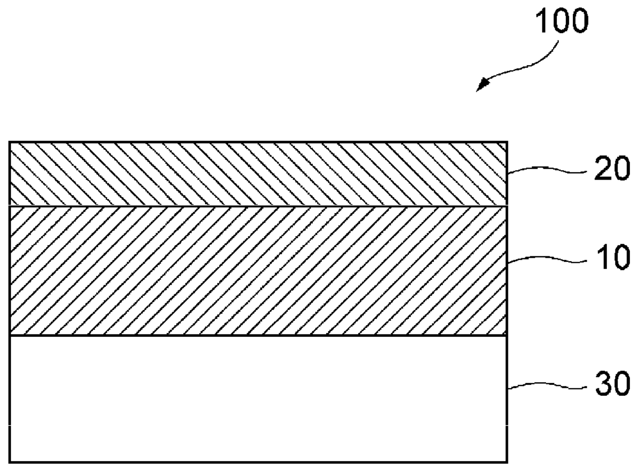
FIG. 2 is a schematic cross-sectional view when the sealing material of the present disclosure is disposed so as to be in contact with a compound having a non-stoichiometric composition.

FIG. 2 illustrate a schematic cross-sectional view when the sealing material 100 of the present disclosure is disposed so as to be in contact with a compound layer 30 having a non-stoichiometric composition. The sealing material 100 may be used such that the polymer layer 10 of the sealing material 100 is located on the side of the compound layer 30 having a non-stoichiometric composition included in the electronic element, and the inorganic oxide insulator layer 20 is located on the side opposite to the compound layer 30 having a non-stoichiometric composition. In FIG. 2, the polymer layer 10 of the sealing material 100 is disposed so as to be in contact with the compound layer 30 having a non-stoichiometric composition, but another layer may be present between the polymer layer 10 of the sealing material 100 and the compound layer 30 having a non-stoichiometric composition, and the polymer layer 10 of the sealing material 100 and the compound layer 30 having a non-stoichiometric composition may not be in direct contact with each other. For example, when the sealing material of the present disclosure is used as a sealing material of a thin-film solar cell, the compound layer having a non-stoichiometric composition may be located inside an intermediate layer of the thin-film solar cell, and another material or an electrode may be laminated on the compound layer having a non-stoichiometric composition.

As described above, when the polymer layer 10 is present between the compound layer 30 having a non-stoichiometric composition and the inorganic oxide insulator layer 20, damage to the compound having a non-stoichiometric composition when the inorganic oxide insulator layer 20 is formed can be suppressed.

Typically, an inorganic oxide insulator layer such as an AlOx layer is directly formed on a material to be sealed and used as the sealing material. However, when the inorganic oxide insulator layer is tried to be directly formed by using an atomic layer deposition (ALD) method on the compound having a non-stoichiometric composition such as an IZOx layer fabricated by the solution process, the compound having a non-stoichiometric composition is deteriorated because the ALD method is process in which the substrate is heated under vacuum and is mediated by water. When the inorganic oxide insulator layer is tried to be directly formed by using the sputtering method on the compound having a non-stoichiometric composition such as the IZOx layer fabricated by the solution process, the compound having a non-stoichiometric composition is deteriorated because the sputtering method is vacuum process.

Since a chemical vapor deposition film (deposited film) such as parylene can be formed by a chemical vapor deposition method (CVD) which is relatively milder than the ALD method and does not require substrate heating, the chemical vapor deposition film such as parylene is also formed as a base for forming the inorganic oxide insulator layer. However, since the compound having a non-stoichiometric composition has very high environmental sensitivity, the compound having a non-stoichiometric composition is also easily damaged by a vacuum environment and generated radicals during formation of the chemical vapor deposition film.

On the other hand, when the first polymer layer containing the organic solvent soluble polymer is formed by the solution process on the compound having a non-stoichiometric composition, the polymer layer can be disposed without substantially damaging the compound having a non-stoichiometric composition.

The first polymer layer can protect the compound having a non-stoichiometric composition from moisture associated with the ALD method or the vacuum environment of the sputtering process. Therefore, the inorganic oxide insulator layer can be formed on the polymer layer without substantially damaging the compound having a non-stoichiometric composition. Since the first polymer layer has a low density and has low gas barrier performance, oxygen passes through the first polymer layer to some extent. The density of the first polymer layer is preferably from 0.4 $g/cm^3$ to 1.3 $g/cm^3$, more preferably from 0.5 $g/cm^3$ to 1.2 $g/cm^3$, still more preferably 0.6 $g/cm^3$ to 1.1 $g/cm^3$, and even still more preferably from 0.7 $g/cm^3$ to 1.0 $g/cm^3$. On the other hand, since the inorganic oxide insulator layer having a dense structure is located on the first polymer layer, moisture and oxygen cannot substantially pass through the sealing material. The density of the first polymer layer is calculated from X-ray reflectivity measurement. By fitting the X-ray reflectivity data, the film thickness and the film density can be simultaneously estimated as fitting parameters.

Examples of the compound having a non-stoichiometric composition include an amorphous metal oxide inorganic semiconductor (AOS), metal chalcogenide, and halide perovskite. Examples of the AOS include ZnO, $In_2O_3$, In—Zn—O (IZO), and In—Ga—Zn—O (IGZO), and particularly, the AOS formed by the solution process. Examples of the metal chalcogenide include layered substances such as molybdenum sulfide, tungsten sulfide, and molybdenum selenide, and quantum dots such as lead sulfide and cadmium sulfide. Examples of the halide perovskite include organic/inorganic hybrid substances represented by $ABX_3$ and $A_2BX_4$ (A is an organic ammonium substance or an alkali metal, B is a metal such as lead or tin, and X is a halogen element) and inorganic metal substances. Whether the AOS layer is amorphous can be confirmed by thin film X-ray diffraction.

Examples of the electronic device including the compound having a non-stoichiometric composition include a transistor, a complementary metal oxide semiconductor device, an organic electroluminescence (organic EL), a battery, an organic solar cell, and an oxide sensor. The transistor includes a thin film transistor and a field effect transistor. The oxide sensor includes a chemical sensor and an optical sensor. The same applies hereinafter.

The sealing material of the present disclosure may have any shape, and may be a sealing film, a sealing sheet, or the like.

The first polymer layer preferably has a thickness of 50 nm or greater, more preferably 75 nm or greater, and still more preferably 100 nm or greater. When the first polymer layer has the above-described preferable thickness, damage to the compound having a non-stoichiometric composition during formation of the inorganic oxide insulator layer can be further suppressed. The upper limit of the thickness of the first polymer layer is not particularly limited. However, the thickness of the first polymer layer may be preferably 1000 nm or less, more preferably 500 nm or less, and may be 100 nm or less, 50 nm or less, or 30 nm or less, and thus the thickness of the electronic device including the sealing material does not increase.

Preferably, the polymer layer further includes a second polymer layer located between the first polymer layer and the inorganic oxide insulator layer, and the second polymer layer includes a chemical vapor deposition film.

When the second polymer layer including the chemical vapor deposition film is located between the first polymer layer and the inorganic oxide insulator layer, damage to the compound having a non-stoichiometric composition during formation of the inorganic oxide insulator layer can be further suppressed. The compound having a non-stoichiometric composition can be protected from attack of radical due to the CVD process for forming the second polymer layer. When the polymer layer includes the second polymer layer, a preferable thickness of the first polymer layer may be thin, or may be 10 nm or greater.

Figure 3:
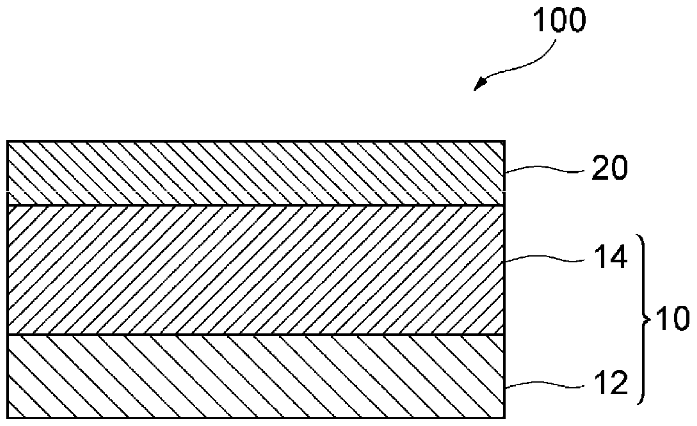
FIG. 3 is a schematic cross-sectional view of a sealing material including a first polymer layer, a second polymer layer, and an inorganic oxide insulator layer.

FIG. 3 is a schematic cross-sectional view of the sealing material 100 including a first polymer layer 12, a second polymer layer 14, and the inorganic oxide insulator layer 20. The sealing material 100 includes the second polymer layer 14 located between the first polymer layer 12 and the inorganic oxide insulator layer 20.

In the sealing material 100 of a hybrid structure including the first polymer layer 12, the second polymer layer 14, and the inorganic oxide insulator layer 20, the first polymer layer 12 including the organic solvent soluble polymer and the second polymer layer 14 including the chemical vapor deposition film function as a buffer layer against damage due to the ALD process or the sputtering process during the formation of the inorganic oxide insulator layer 20, and the inorganic oxide insulator layer 20 has a strong barrier effect.

Unlike the first polymer layer formed by the solution process, the chemical vapor deposition film is formed by a dry process. Therefore, since the second polymer layer includes the chemical vapor deposition film, the second polymer layer is dense and has a high barrier effect. The density of the second polymer layer including the chemical vapor deposition film is higher than the density of the first polymer layer containing the organic solvent soluble polymer. The density of the second polymer layer is preferably from 1.0 g/cm$^3$ to 1.5 g/cm$^3$, and more preferably from 1.0 g/cm$^3$ to 1.45 g/cm$^3$. The density of the second polymer layer is measured by ASTM D1505 or ASTM E1461.

The thickness of the second polymer layer including the chemical vapor deposition film is preferably from 10 nm to 40 nm, and more preferably from 15 nm to 35 nm. Since the second polymer layer has a higher density, the barrier effect can be obtained even in the above-described preferable thickness range, and thus the total thickness of the sealing material can be reduced.

The thickness of the inorganic oxide insulator layer is preferably from 5 nm to 100 nm, more preferably from 15 nm to 75 nm, and still more preferably from 25 nm to 55 nm. Since the inorganic oxide insulator layer has a higher barrier effect than the polymer layer, which is the organic film, the total thickness of the sealing material can be reduced while exhibiting a good barrier effect in the above-described preferable thickness range. Since the inorganic oxide insulator layer has the dense structure and is relatively hard, the thickness of the inorganic oxide insulator layer is preferably 100 nm or less from the viewpoint of ensuring flexibility of the electronic element or electronic device including sealing material.

When the sealing material includes the first polymer layer containing the organic solvent soluble polymer, the second polymer layer including the chemical vapor deposition film, and the inorganic oxide insulator layer, the total thickness of the sealing material is preferably 100 nm or less, more preferably 90 nm or less, and still more preferably 80 nm or less. When the second polymer layer including the chemical vapor deposition film is provided, the total thickness of the sealing material can be reduced. The lower limit of the thickness of the sealing material is preferably 25 nm or greater, and more preferably 40 nm or greater. When the thickness of the sealing material is in the above-described preferable range, the thickness of the electronic element or electronic device provided with the sealing material can be reduced while obtaining the good barrier function.

The organic solvent soluble polymer is preferably an acrylic polymer, a styrenic polymer, a fluorine-based polymer, a thermally crosslinkable polymer, or a combination thereof.

The acrylic polymer is preferably polymethyl methacrylate (PMMA), polyadamantyl methacrylate (PADMA), or polycyclohexyl methacrylate (PCMA).

The styrenic polymer is preferably polystyrene, poly-α-methylstyrene (PαMS), poly-4-methylstyrene (PMS), or polyvinylphenol (PVP).

The fluorine-based polymer is preferably CYTOP (trade name) or Teflon (trade name) AF.

The thermally crosslinkable polymer is preferably an epoxy resin or a thermally curable cycloolefin polymer.

An inorganic oxide insulator of the inorganic oxide insulator layer is preferably AlOx, HfOx, ZrOx, SiOx, TiOx, or a combination thereof. x may be a value satisfying the stoichiometric composition or may be a value not satisfying the stoichiometric composition. The inorganic oxide insulator layer has a high density, and large molecules such as water molecules and oxygen in the air cannot pass through the inorganic oxide insulator layer, and thus the inorganic oxide insulator layer has a high barrier effect against moisture and gases.

The chemical vapor deposition film is preferably parylene. Parylene is sequentially formed at around room temperature, and thus is preferable in terms of high denseness and uniformity. Parylene also includes derivatives thereof.

The sealing material preferably has a three layer hybrid structure of a PMMA layer as the first polymer layer, a parylene layer as the second polymer layer, and an AlOx layer as the inorganic oxide insulator layer. The hybrid three layer sealing film of PMMA/parylene/AlOx can obtain strong protection without deteriorating the performance of the compound having a non-stoichiometric composition.

Figure 21:
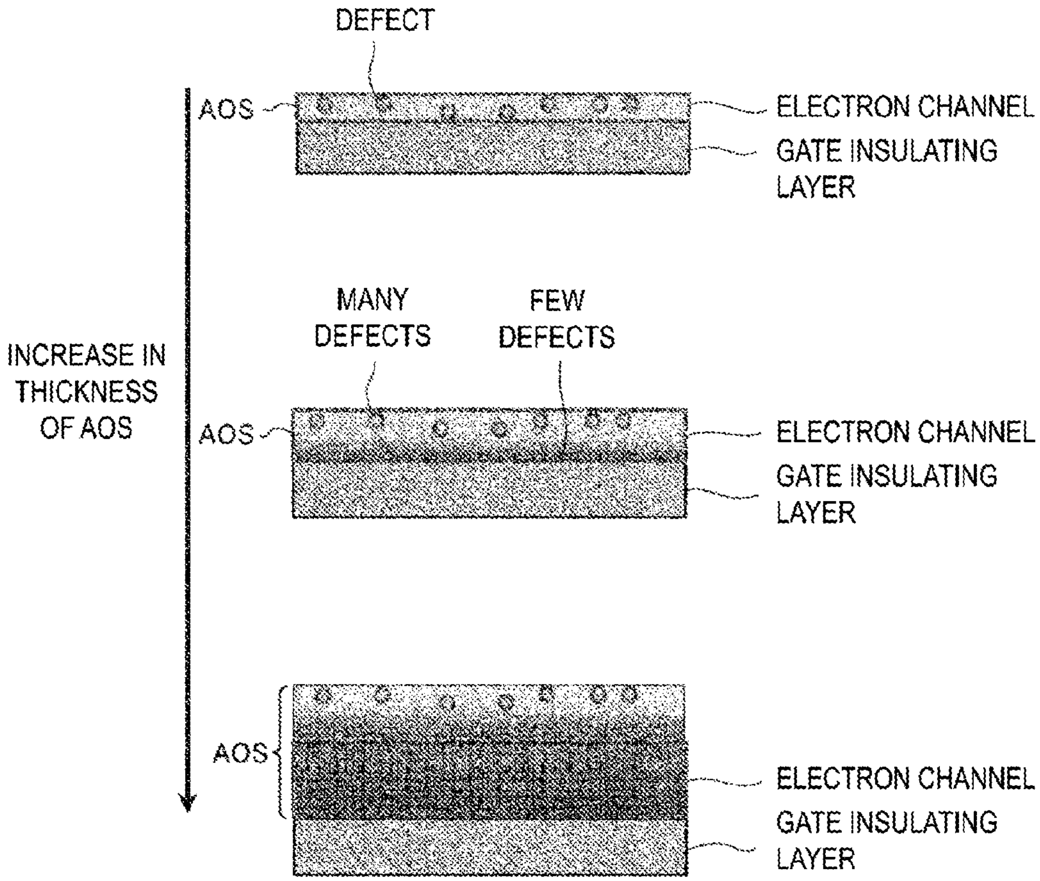
FIG. 21 illustrates schematic cross-sectional views each illustrating distribution of oxygen deficiency states depending on the thickness of the AOS film.

The compound having a non-stoichiometric composition is preferably the amorphous metal oxide inorganic semiconductor (AOS) film. As schematically illustrated in FIG. 21, the AOS film preferably has different distribution of oxygen deficiency state in a direction perpendicular to a main surface of the AOS film, and includes a surface and an inside, the surface including more oxygen deficiency than the inside.

The distribution of the oxygen defect amount of the AOS layer in the thickness direction can be evaluated by measuring an angle dependence of a ratio ($\eta_{M\text{-}O\text{-}M}$) of M-O-M (in a metal oxide state) to the entire O1s by angle-resolved X-ray photoelectron spectroscopy (XPS). In the AOS layer having the distribution of the oxygen defect amount in the thickness direction, the closer to the outermost surface of the AOS layer, the less M-O-M (M: In or Zn) bonds.

Figure 20:
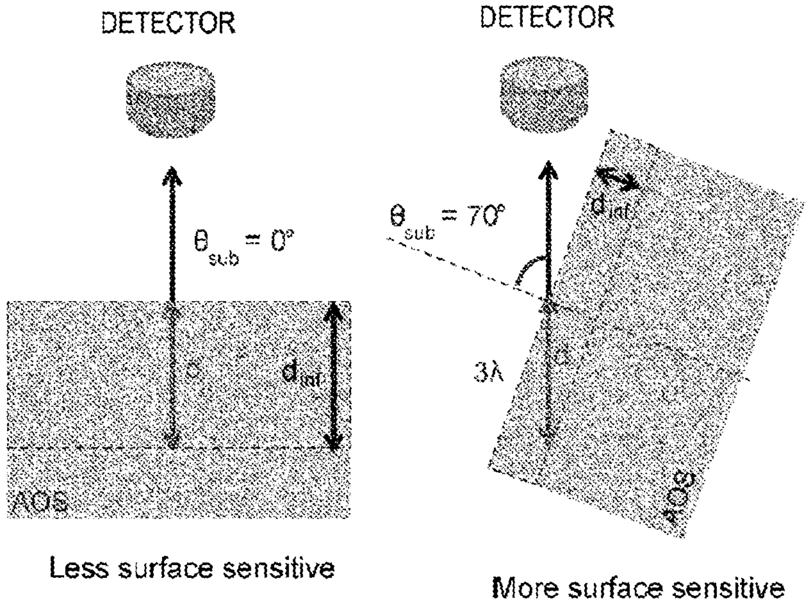
FIG. 20 illustrates schematic views of a measurement method of angle-resolved XPS.

As illustrated in FIG. 20, the angle-resolved XPS is a method for detecting chemical species in a range from a surface of a measurement target film to a predetermined depth (information depth $d_{inf}$) represented by the following equations 1 and 2:

[Equation 1]

$$I_{(d)} = I_0 e^{-\frac{d}{\lambda}} \quad (1)$$

where $I_0$ is an incident electron intensity, $I_{(d)}$ is effective intensity at a depth d from a surface, λ, is an inelastic mean free path of electrons in a solid (estimated to be about 2.8 nm under the present measurement condition), and 3λ, is an escape depth ($I_{(d)}$ to $I_0 \times 5\%$), and

[Equation 2]

$$d = \frac{d_{inf}}{\cos\theta_{sub}} \quad (2)$$

where d is a depth from the surface, $d_{inf}$ is a detection depth (information depth), and $\theta_{sub}$ is a tilt angle of the substrate, by changing an angle (inclination angle θ) with respect to an XPS detector (analyzer) with reference (0°) to a direction perpendicular to a surface of a measurement sample. The inclination angle θ can be set in a range from 0° to less than 90°, and preferably from 0° to 70°.

In the AOS layer, a ratio of $\eta_{M\text{-}O\text{-}M}$ of the outermost surface to $\eta_{M\text{-}O\text{-}M}$ of the inside is preferably smaller by 10% or more, more preferably smaller by 15% or more, and still more preferably smaller by 20% or more.

The sealing material of the present disclosure can be used in the electronic element. The sealing film of the present disclosure can be used as a sealing material for covering an electronic element containing the compound having a non-stoichiometric composition preferably disposed on a flexible substrate. Examples of the electronic device including the electronic element include a transistor, a complementary metal oxide semiconductor device, an organic EL, a battery, a solar cell, and an oxide sensor.

The present disclosure is also directed to a method for manufacturing a sealing material for a compound having a non-stoichiometric composition, the method including providing a substrate, preparing an organic solvent containing a first polymer dissolved, forming a polymer layer including a first polymer layer on the substrate by applying an organic solvent containing the first polymer dissolved, and forming an inorganic oxide insulator layer on the polymer layer by using an atomic layer deposition method or a sputtering method to obtain a sealing material.

In the present method, an organic solvent containing the first polymer dissolved is prepared. By mixing the organic solvent and the first polymer, the organic solvent containing the first polymer dissolved can be prepared. The concentration of the first polymer may be changed depending on the desired thickness of the first polymer layer, and is, for example, from 1 mg/mL to 80 mg/mL, from 2 mg/mL to 70 mg/mL or from 3 mg/mL to 60 mg/mL.

In the present method, the organic solvent containing the first polymer dissolved is applied onto the substrate to form the polymer layer including the first polymer layer. an application method is preferably a spin coating method, a bar coating method, a spray coating method, a dip coating method, an ink-jet method, a flexographic printing method, or a gravure printing method, more preferably the spin coating method, the bar coating method, the spray coating method, the dip coating method, or the ink-jet method, and still more preferably the spin coating method.

The inorganic oxide insulator layer is formed using the atomic layer deposition (ALD) method or the sputtering method, and preferably the atomic layer deposition (ALD) method. The ALD method is preferable in that a film having a large area can be formed and cost can be reduced.

The film formation temperature of the inorganic oxide insulator layer is preferably 200° C. or less, more preferably 150° C. or less, and still more preferably 125° C. or less. By forming the film in the preferable temperature range, a layer below the inorganic oxide insulator layer is less likely to be damaged. In particular, since the flexible substrate contains an organic material such as polyethylene terephthalate (PET) or polyimide, by forming the film in the preferable temperature range, the damage to the substrate can be suppressed.

Preferably, the forming the polymer layer includes forming a second polymer layer which is a chemical vapor deposition film on the first polymer layer by using a chemical vapor deposition method (CVD), and the forming the inorganic oxide insulator layer includes forming the inorganic oxide insulator layer on the second polymer layer.

The second polymer layer, which is the chemical vapor deposition film, is formed by CVD. CVD is gentle vacuum process and is preferable in terms of deposition rate, processing area, denseness, and uniformity.

The contents regarding the above-described the sealing material are applied to the polymer layer, the first polymer layer, the second polymer layer, the inorganic oxide insulator layer, the organic solvent soluble polymer, the organic solvent, and other configurations.

EXAMPLES

Example 1

Fabrication of TFT including Two Layer Sealing Material and IZO

Preparation of AOS Precursor Solution by Sol-Gel Method

Figure 16:
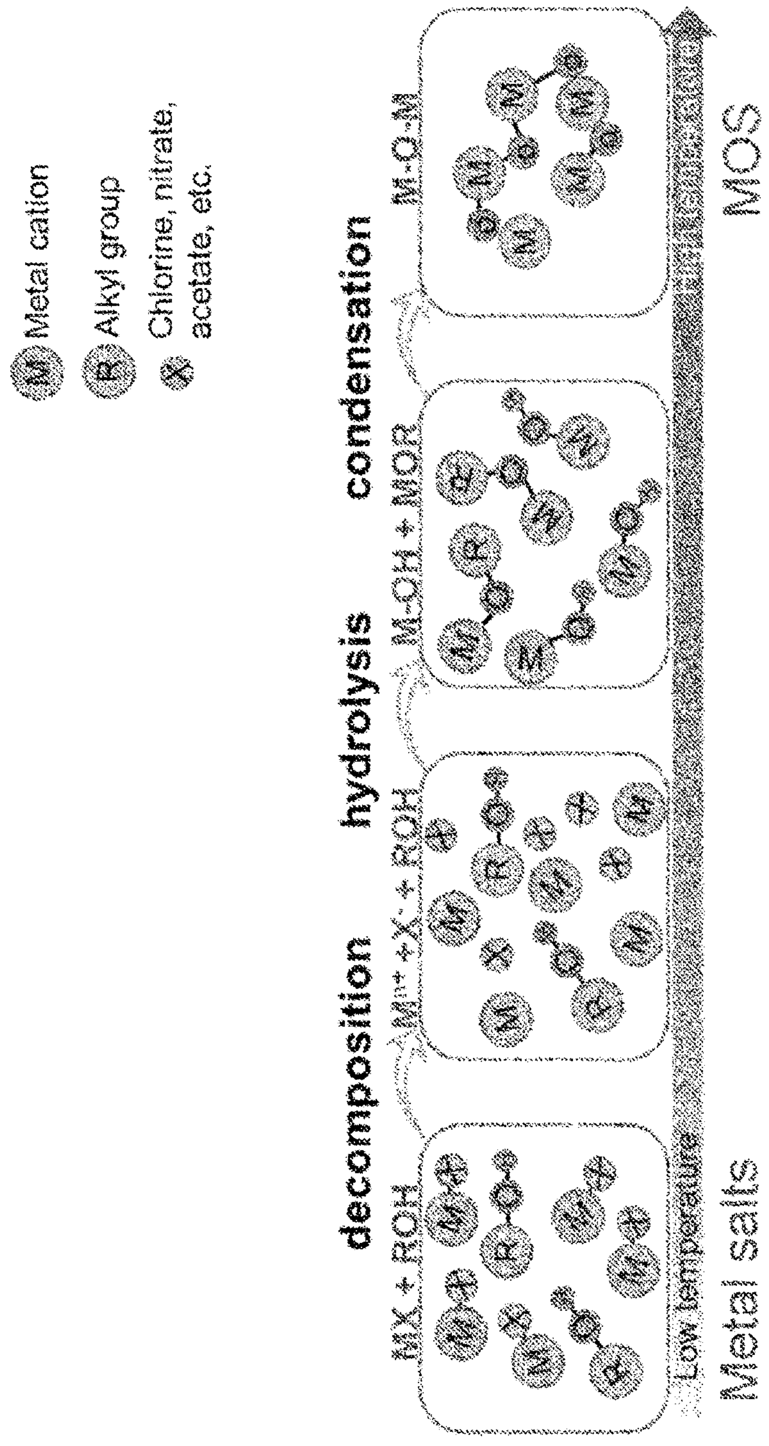
FIG. 16 is a schematic view illustrating a method for preparing a precursor solution of an amorphous metal oxide inorganic semiconductor (AOS) by using a sol-gel method.

A precursor solution of indium zinc oxide (IZO) was prepared by the sol-gel method schematically illustrated in FIG. 16. 0.462 g of $In(NO_3)_3$-$xH_2O$ (Aldrich) was added to 10 mL of 2-methoxyethanol, and the mixture was stirred under air atmosphere for 6 hours to obtain a precursor solution (0.1 M) of indium. 0.297 g of $Zn(NO_3)_2$-$xH_2O$ (Aldrich) was added to 10 mL of 2-methoxyethanol, and the mixture was stirred under air atmosphere for 6 hours to obtain a precursor solution (0.1 M) of zinc. The obtained precursor solutions of indium and zinc were mixed at a molar ratio of In:Zn=3:2 and the mixture was stirred under air atmosphere for 6 hours to prepare a precursor solution of IZO.

A P-doped Si wafer substrate including thermally oxidized $SiO_2$ (having a thickness of 100 nm) as a gate insulating film was ultrasonically cleaned in acetone and then in 2-propanol for 10 minutes each, and then dried at 100° C. for 10 minutes under air atmosphere by using a hotplate.

Formation of AOS Layer

The cleaned and dried substrate was subjected to a treatment with a UV ozone cleaner (UV253H available from Filgen, Inc.) for 10 minutes to remove the organic residue and improve wettability.

Figure 17:
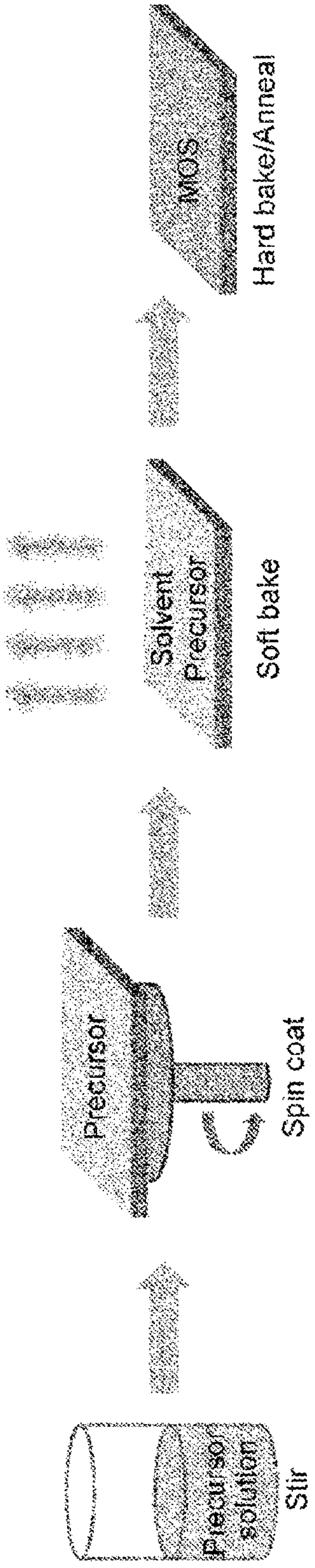
FIG. 17 is a schematic view illustrating a method for forming an AOS layer by using a spin coating method.

As schematically illustrated in FIG. 17, the prepared IZO precursor solution was spin coated on the substrate subjected to the above-described UV treatment at 500 rpm for 5 seconds and then at 5000 rpm for 30 seconds to form an IZO intermediate film. Next, the formed IZO intermediate film was subjected to the heat treatment at 150° C. for 5 minutes in the air atmosphere and further subjected to the heat treatment at 370° C. for 1 hour to form the AOS film (IZO film) having a thickness of 6 nm.

The source/drain (S/D) electrodes (Al, 40 nm) were formed and patterned on the IZO film by thermal evaporation using a metal mask. Further, the IZO film was patterned by an yttrium aluminum garnet (YAG) laser, subjected to a heat treatment at 90° C. for 3 hours under air atmosphere, and gradually cooled to a room temperature to obtain the IZO active layer.

Formation of Sealing Material

Butyl acetate solution (50 mg/mL) in which PMMA (Mw: 120000) was dissolved was spin coated at 500 rpm for 5 seconds and at 4000 rpm for 30 seconds on the gate insulating layer on which the IZO active layer and the S/D electrodes were formed, and then subjected to heat treatment at 150° C. for 2 hours to form the PMMA layer having a thickness of 100 nm. AlOx having a thickness of 40 nm was deposited on the PMMA layer by the ALD method while the substrate temperature was maintained at 110° C. to form a sealing film of two layers of PMMA layer/AlOx layer. Thus, the bottom-gate-top-contact TFT including the sealing material and the IZO film was fabricated.

Figure 4:
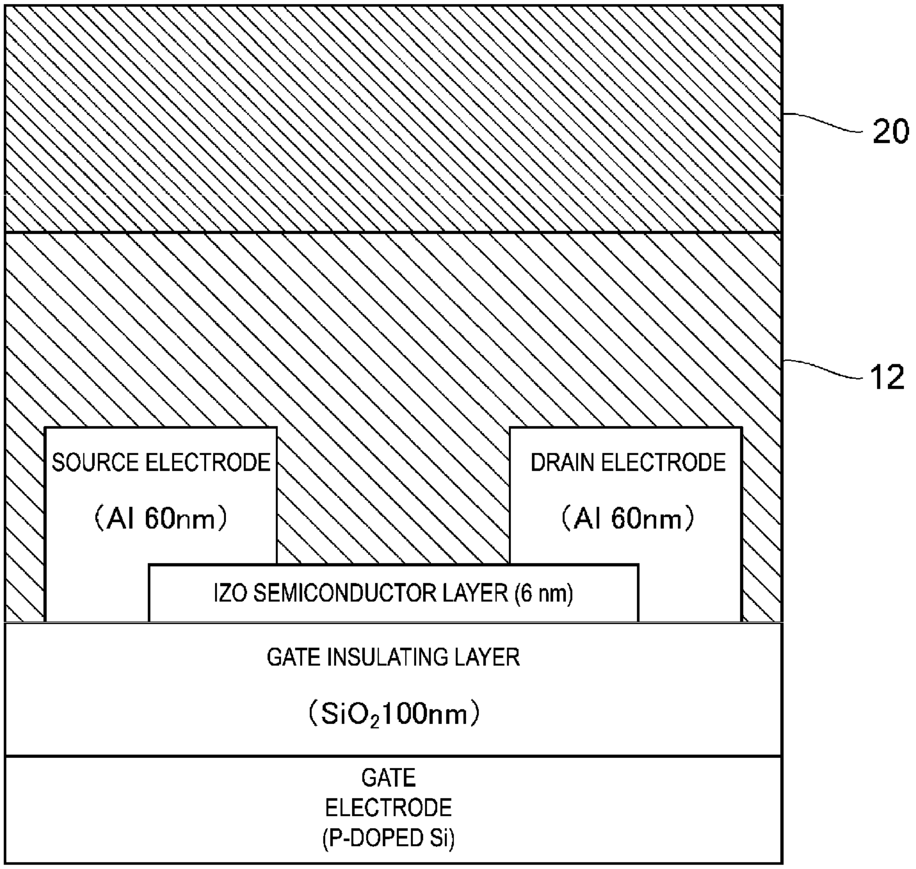
FIG. 4 is a schematic cross-sectional view of a TFT fabricated in an example.

FIG. 4 illustrates a schematic cross-sectional view of the fabricated TFT. The fabricated TFT had the channel length (L) of 100 μm and the channel width (W) of 2000 μm.

Example 2

Fabrication of TFT Including Three Layer Sealing Material and IZO

An IZO precursor solution was prepared under the same conditions as in Example 1. By a lift-off method in which Cr/Au/Cr was vapor-deposited on a pattern formed of photoresist (TLOR, Tokyo Ohka Kogyo Co., Ltd.) and then the photoresist was removed, a gate electrode of Cr/Au/Cr having thicknesses of 5 nm/25 nm/5 nm, respectively, was formed on a glass substrate. An AlOx gate insulating film having a thickness of 75 nm was formed by the ALD method.

The substrate on which the AlOx gate insulating film was formed was treated with a UV ozone cleaner for 10 minutes, and then the IZO film was formed under the same conditions as in Example 1. The formed IZO film was subjected to photolithography using a photosensitive dielectric (PDM, TAIYO INK MFG. CO., LTD.) and wet etching using a 1.75 mass % oxalic acid aqueous solution to form an IZO active layer which was a patterned n-type semiconductor.

Thereafter, photolithography was performed using a photosensitive dielectric (PDM, TAIYO INK MFG. CO., LTD.), and Al thermal evaporation and lift-off was performed using the resulting PDM as a shadow mask to form source/drain S/D electrodes having a thickness of 60 nm. Next, a laminate body on which the S/D electrodes were formed was subjected to the heat treatment at 90° C. for 3 hours under air atmosphere, and gradually cooled to a room temperature.

Butyl acetate solution (5 mg/mL) in which PMMA (Mw: 120000) was dissolved was spin coated at 500 rpm for 5 seconds and at 4000 rpm for 30 seconds on the gate insulating layer on which the IZO active layer and the S/D electrodes were formed, and then subjected to heat treatment at 150° C. for 1 hour to form the PMMA layer having a thickness of 13 nm.

A parylene layer having a thickness of 25 nm was deposited on the PMMA layer by using the CVD method. AlOx having a thickness of 40 nm was deposited on the parylene layer by the ALD method while the substrate temperature was maintained at 110° C. to form a sealing film of three layers of PMMA layer/parylene layer/AlOx layer. Thus, the bottom-gate-top-contact TFT including the sealing material and the IZO film was fabricated.

Figure 5:
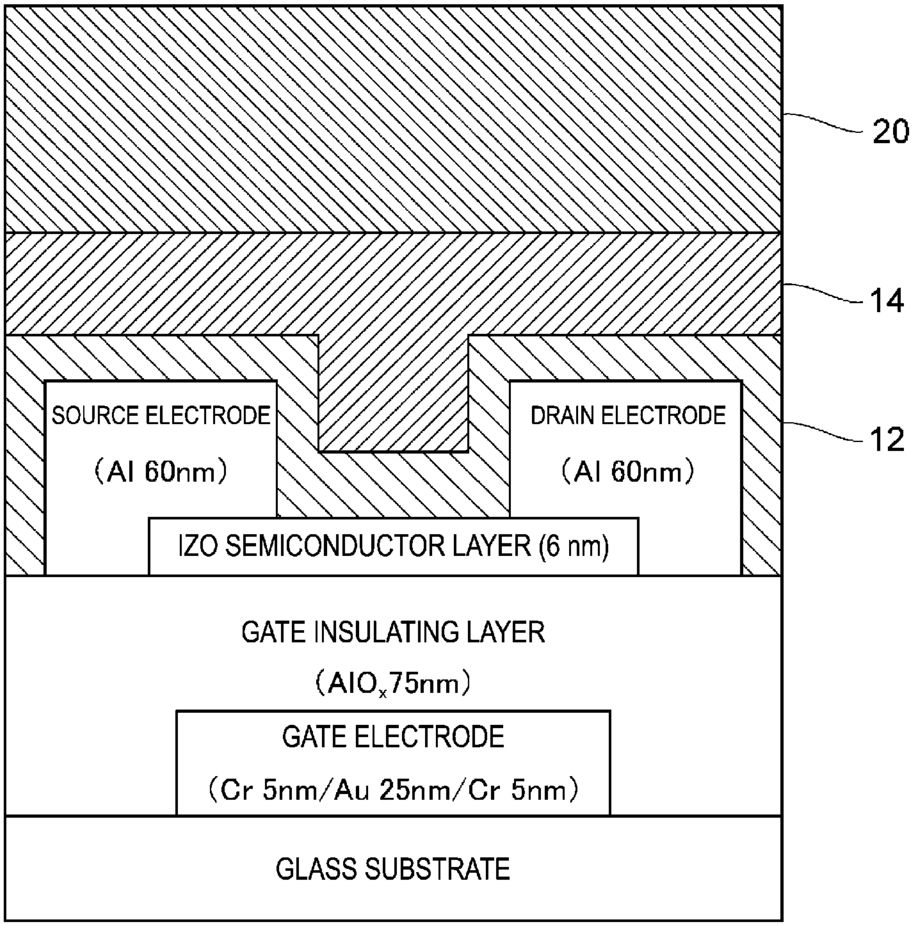
FIG. 5 is a schematic cross-sectional view of a TFT fabricated in an example.
Figure 6:
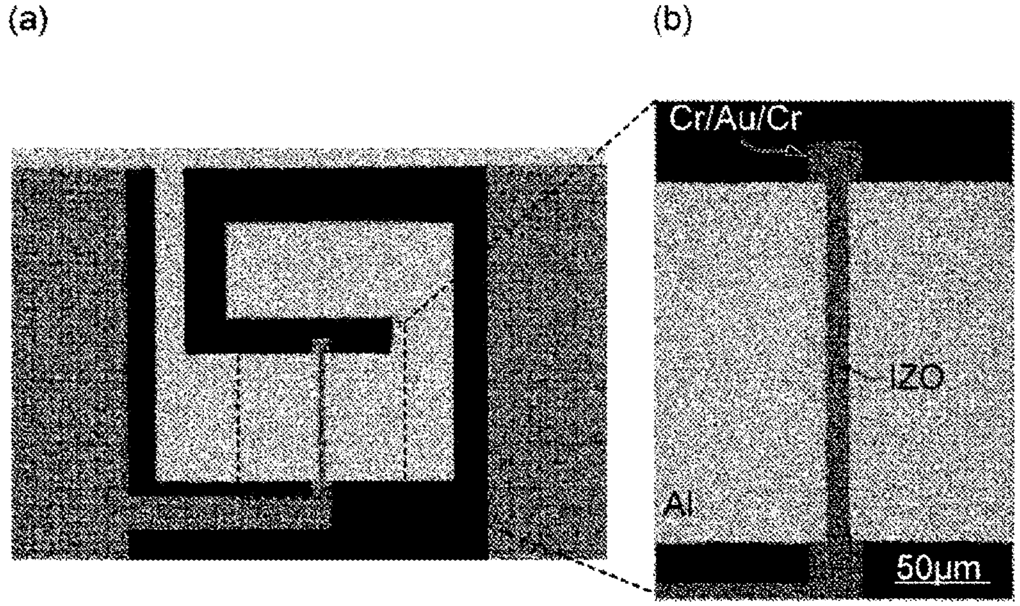
FIG. 6 is optical microscope photographs of a TFT fabricated in an example.

FIG. 5 illustrates a schematic cross-sectional view of the fabricated TFT. FIG. 6 is optical microscope photographs of the fabricated TFT. The fabricated TFT had the channel length (L) of 10 μm and the channel width (W) of 200 μm. FIG. 6(*a*) is an optical microscope photograph of the fabricated TFT observed from above, and FIG. 6(*b*) is an enlarged photograph of a portion surrounded by a square in FIG. 6(*a*).

Comparative Example 1

A TFT was fabricated in the same manner as in Example 2 except that the sealing film was a PMMA single layer having a thickness of 13 nm.

Comparative Example 2

A TFT was fabricated in the same manner as in Example 2 except that the sealing film was a parylene single layer having a thickness of 25 nm.

Comparative Example 3

A TFT was fabricated in the same manner as in Example 2 except that the sealing film was an AlOx single layer having a thickness of 40 nm.

Comparative Example 4

A TFT was fabricated in the same manner as in Example 2 except that the sealing film was not formed.

Comparative Example 5

A TFT was fabricated in the same manner as in Example 2, except that the sealing film was the PMMA layer having a thickness of 13 nm and a parylene layer having a thickness of 25 nm disposed on the PMMA layer.

Using a semiconductor parameter analyzer (Keithley 4200-SCS), electrical measurements of the TFTs fabricated in the example and comparative examples were performed at a room temperature and dark place condition. The thicknesses of the IZO film and PMMA layer were measured by X-ray reflectivity measurement (XRR, Rigaku SmartLab, CuKα radiation, λ=1.5416 Å). The surface roughness was measured using an atomic force microscope (AFM, SPM-9700HT manufactured by Shimadzu Corporation). During measurement of the characteristics, a through hole was formed in the sealing material by a YAG laser, and conduction was secured by using a silver paste.

Evaluation of Influence by TFT Fabrication Process on Performance of Active Layer The transfer characteristics of the TFTs fabricated in Comparative Examples 1 to 4 were measured to evaluate the influence by the TFT fabrication process on the performance of the active layer.

Figure 7:
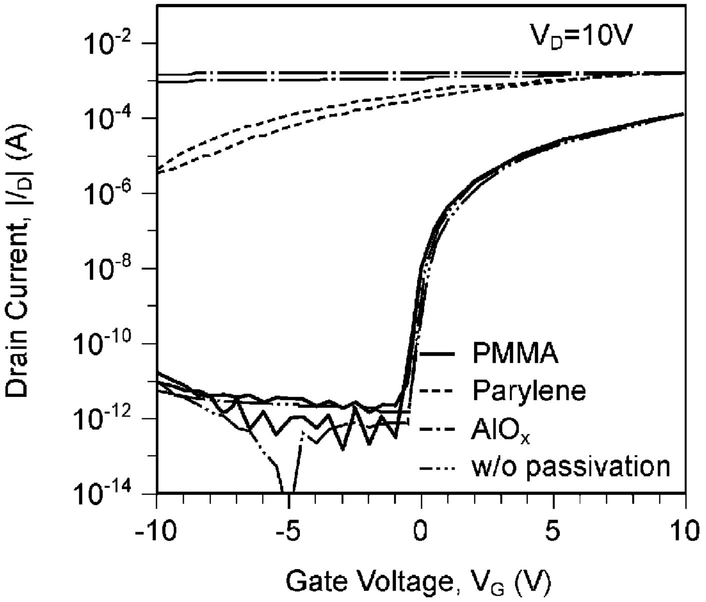
FIG. 7 is a graph showing transfer characteristics of TFTs fabricated in comparative examples.

FIG. 7 shows measurement results of transfer characteristics of the TFTs each including a respective one of the sealing materials of Comparative Example 1 (PMMA single layer), Comparative Example 2 (parylene single layer), and Comparative Example 3 (AlOx single layer), and the TFT not including the sealing material of Comparative Example 4.

The TFT of Comparative Example 4 (without sealing material) had a saturation mobility ($\mu_{sat}$) of 2.3 $cm^2V^{-1}s^{-1}$, an on/off current ratio ($I_{on}/I_{off}$) of about $10^8$, and a threshold voltage (Vth) of 2.0 V. This value is the reference value for comparison.

The TFT of Comparative Example 1 (PMMA single layer) exhibited desirable characteristics such as $\mu_{sat}$ of 2.0 $cm^2V^{-1}s^{-1}$, $I_{on}/I_{off}\approx 10^8$, Vth of 1.7 V, and negligible hysteresis.

In the TFT of Comparative Example 2 (parylene single layer), Vth was greatly shifted to the negative side. This is considered to be because the IZO active layer having a non-stoichiometric composition was affected by a long-time vacuum state during parylene vapor deposition and reactive radical species derived from a parylene source that may react with weakly bonded oxygen atoms.

In the TFT of Comparative Example 3 (AlOx single layer), Vth was greatly shifted to the negative side. The performance was further deteriorated as compared with the TFT of Comparative Example 2 (parylene single layer). This is considered to be due to the harsh conditions of the ALD method, such as high vacuum, high temperature (110° C.), and the use of water as the reactive species. Thus, the parylene coating process and the ALD method changed the characteristics of the IZO active layer having a non-stoichiometric composition.

Evaluation of Three Layer Sealing Material

Figure 8:
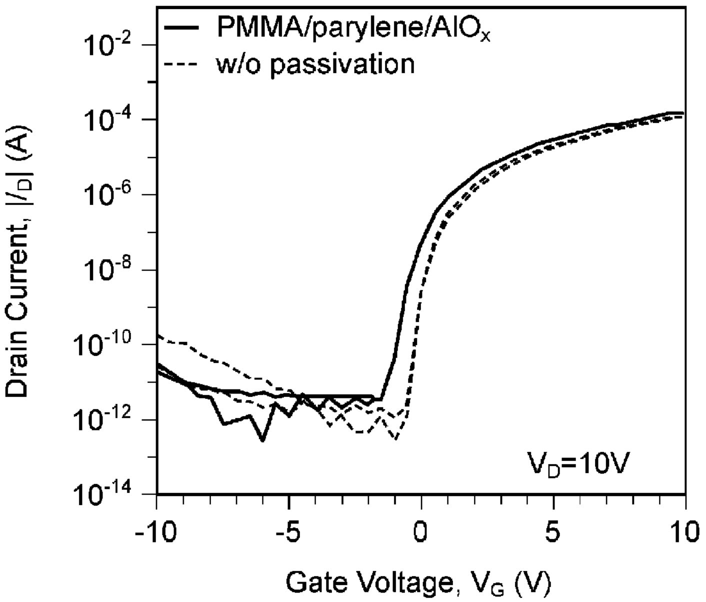
FIG. 8 is a graph showing transfer characteristics of TFTs fabricated in an example and a comparative example.

FIG. 8 shows measurement results of transfer characteristics of the TFT including the sealing material of Example 2 (three layers of PMMA layer/parylene layer/AlOx layer), and the TFT not including the sealing material of Comparative Example 4.

As compared with the TFT of Comparative Example 4, the TFT of Example 2 showed substantially the same characteristics. That is, it was confirmed that the two layers of PMMA layer/parylene layer functioned as a protective layer during formation of the AlOx film by the ALD method.

Evaluation of Constituent Elements of Sealing Material Against Moisture

The TFT of Comparative Example 1 (PMMA single layer), the TFT of Comparative Example 4 (without sealing material), and the TFT of Comparative Example 5 (PMMA/parylene bilayer) were immersed in deionized water for 15 minutes and air-dried (hereinafter referred to as water treatment). The transfer characteristics of each TFT subjected to the water treatment were measured to evaluate the waterproof characteristics. Evaluation was performed based on the characteristics of the TFT of Comparative Example 4 (without sealing material) before the water treatment as a reference.

Figure 9:
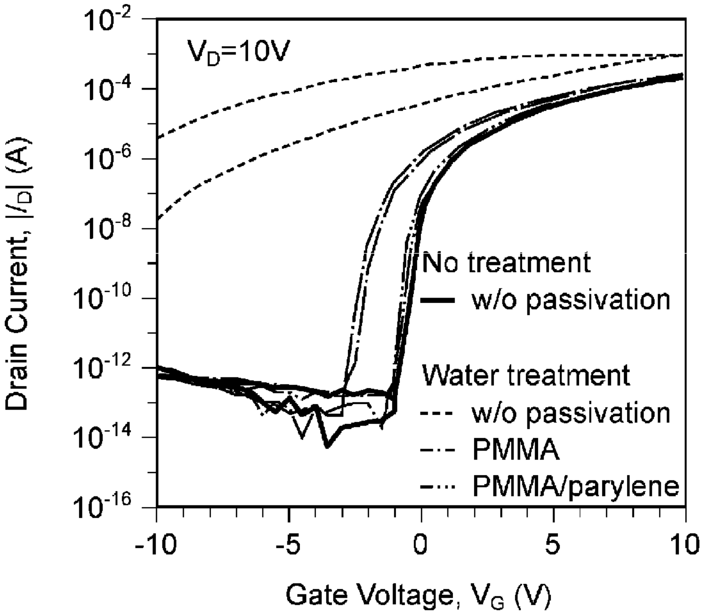
FIG. 9 is a graph showing transfer characteristics of the TFTs fabricated in the comparative examples before and after water treatment.

FIG. 9 shows the characteristics of the TFT of Comparative Example 4 (without sealing material) before and after the water treatment, and the characteristics of the TFT of Comparative Example 1 (PMMA single layer) and the TFT of Comparative Example 5 (PMMA/parylene bilayer) after the water treatment.

In the TFT of Comparative Example 4 (without sealing material), since a large amount of water was incorporated and remained in a back channel layer by the water treatment, the water acted as charge donors and charge traps, the Vth shift became significantly negative, and a large hysteresis was observed.

In the TFT of Comparative Example 1 (PMMA single layer), a slight Vth shift was observed, but the hysteresis was negligible. The TFT of Comparative Example 5 (PMMA/parylene bilayer) exhibited substantially the same characteristics as the TFT of Comparative Example 4 (without sealing material) before the water treatment. That is, it was found that the PMMA/parylene bilayer has a strong protective ability against moisture, and it can be seen that the PMMA/parylene bilayer also has a protective ability against the film forming process by the ALD method. Due to the low moisture permeability of parylene, the PMMA/parylene bilayer has a better buffer function than the PMMA single layer during AlOx deposition.

Evaluation of Bias Stress Stability

Figure 10:
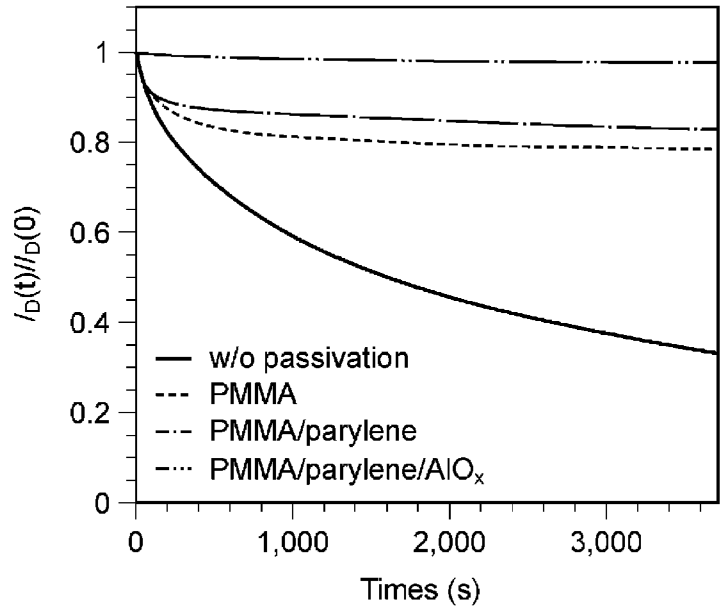
FIG. 10 is a graph showing measured bias stress stability of TFTs fabricated in the example and the comparative examples.

With respect to the TFT of Example 2 (three layers of PMMA layer/parylene layer/AlOx layer), the TFT of Comparative Example 1 (PMMA single layer), the TFT of Comparative Example 4 (without sealing material), and the TFT of Comparative Example 5 (PMMA/parylene bilayer), bias stress stability at room temperature (25° C.) was evaluated. FIG. 10 shows the measurement results of the bias stress stability.

The bias stress stability was evaluated by measuring a drain current ($I_D$) throughout the entire process and calculating an $I_D$ decrease rate after 3700 seconds, the decrease rate being defined by the following equation 3.

[Equation 3]

$$I_D \text{ drop rate} = \left(1 - \frac{I_D(t)}{I_D(0)}\right) \times 100\% \tag{3}$$

Here, $I_D(0)$ is an initial drain current and $I_D(t)$ is the $I_D$ after applying bias stress at a respective time (t).

When the gate bias was constant, the $I_D$ tended to gradually decrease in all the TFTs. This is considered to be because the absorbed oxygen could take electrons away from the conductive bond as indicated by the following formula:

$$O_2(g)+e^-(s)=2O^-(s).$$

In the TFT of Comparative Example 4 (without sealing material), the $I_D$ decrease rate was 67%, and the stability of the bias stress was the worst. The $I_D$ decrease rate of the TFT of Comparative Example 1 (PMMA single layer) was suppressed to 21%, and the $I_D$ decrease rate of the TFT of Comparative Example 5 (PMMA/parylene bilayer) was suppressed to 17%. In particular, in the TFT of Example 2 (three layers of PMMA layer/parylene layer/AlOx layer), the $I_D$ decrease rate was significantly suppressed, and the $I_D$ decrease rate was 2%.

Evaluation of Vth Shift Before and After Bias Stress

Figure 11:
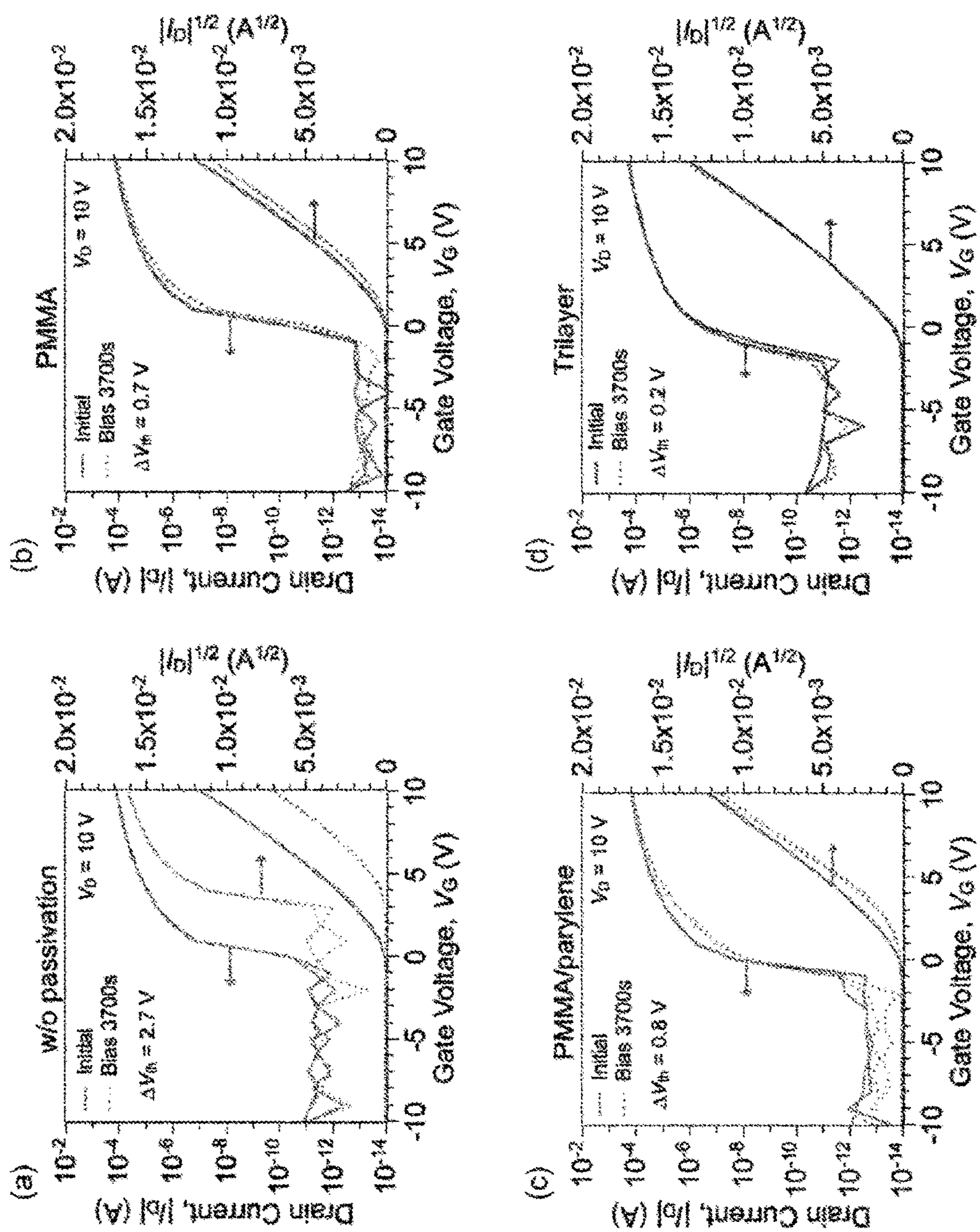
FIG. 11 is graphs showing the Vth shift values (ΔVth) estimated by measuring the transfer characteristics before and after the bias stress of the TFTs fabricated in the example and the comparative examples.

With respect to the TFT of Example 2 (three layers of PMMA layer/parylene layer/AlOx layer), the TFT of Comparative Example 1 (PMMA single layer), the TFT of Comparative Example 4 (without sealing material), and the TFT of Comparative Example 5 (PMMA/parylene bilayer), the transfer characteristics were measured before and after the bias stress to estimate the Vth shift values (ΔVth). FIG. 11 shows measurement results of the transfer characteristics before and after the bias stress.

As shown in FIG. 11(*a*), the ΔVth of the TFT of Comparative Example 4 (without sealing material) was 2.8 V. As shown in FIG. 11(*b*), the ΔVth of the TFT of Comparative Example 1 (PMMA single layer) was 0.7 V. As shown in FIG. 11(*c*), the ΔVth of the TFT of Comparative Example 5 (PMMA/parylene bilayer) was 0.8 V. As shown in FIG. 11(*d*), in the TFT of Example 2 (three layers of PMMA layer/parylene layer/AlOx layer), the ΔVth was suppressed to 0.2 V. This is because the IZO active layer was not damaged by the barrier effect of the PMMA/parylene buffer layer when the AlOx film was formed by the ALD method.

Evaluation of Effect of Two Layer Sealing Material

Figure 12:
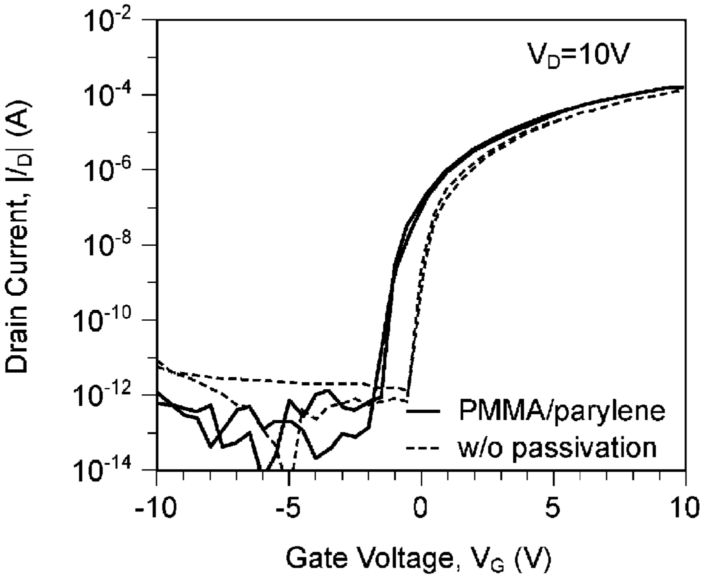
FIG. 12 is a graph showing measurement results of transfer characteristics of the TFTs fabricated in the comparative examples.

FIG. 12 shows measurement results of transfer characteristics of the TFT including the sealing material of Comparative Example 5 (PMMA/parylene bilayer), and the TFT not including the sealing material of Comparative Example 4.

Figure 13:
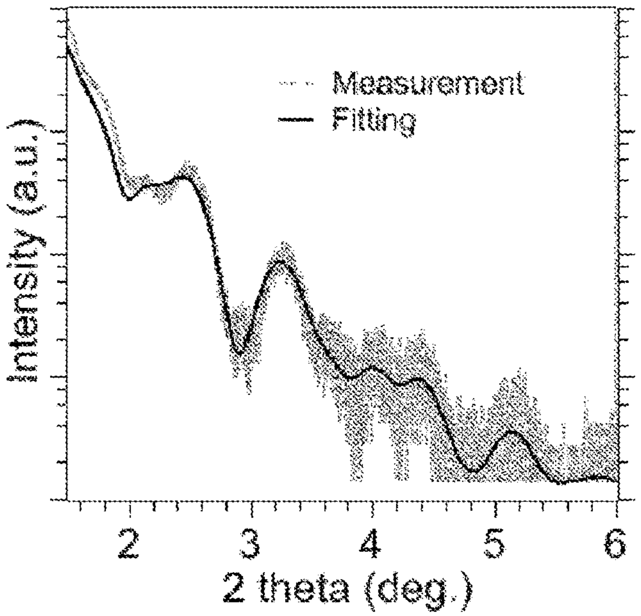
FIG. 13 shows a film thickness evaluation result by X-ray reflectivity measurement of a PMMA layer formed in the comparative example.

As compared with the TFT of Comparative Example 4 (without sealing material), there was less change in the TFT of Comparative Example 5 (PMMA/parylene bilayer). FIG. 13 shows the measurement result of the X-ray reflectivity of the PMMA layer formed under the same conditions as in Comparative Example 5. It can be seen that the IZO active layer having a non-stoichiometric composition could be effectively protected from radicals during parylene deposition despite the fact that the PMMA layer was only 13 nm thick.

Figure 14:
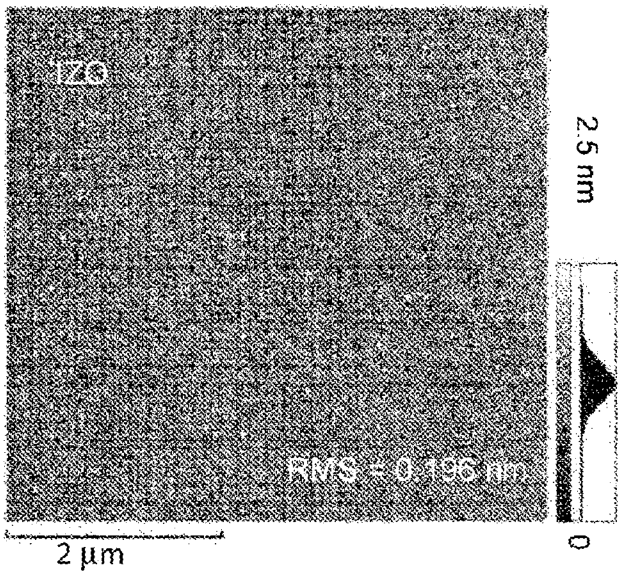
FIG. 14 is an AFM measurement image of an IZO layer fabricated in the example.
Figure 15:
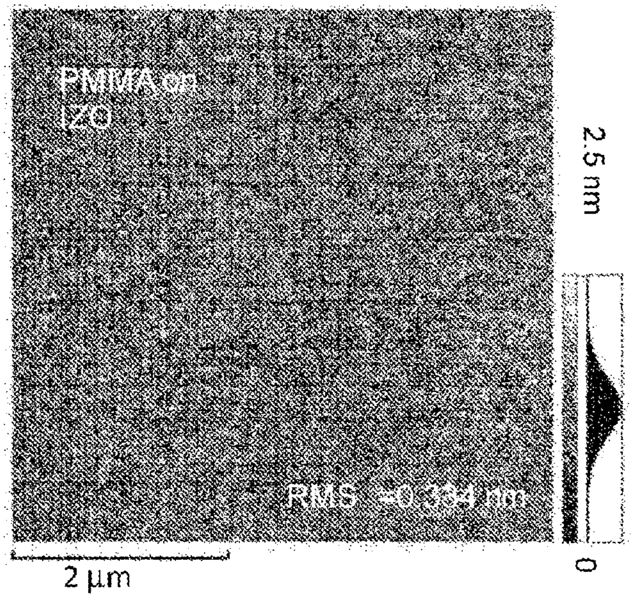
FIG. 15 is an AFM measurement image of a PMMA layer fabricated in the example.

FIG. 14 shows an AFM measurement image of the IZO layer fabricated under the same conditions as in Example 1. FIG. 15 shows an AFM measurement image of the PMMA layer formed on the IZO layer fabricated under the same conditions as in Example 1. The surface roughness RMS of the IZO layer was 0.196 nm, and the PMMA layer formed on the IZO layer had a flat and pinhole-free structure and had the surface roughness RMS of 0.334 nm.

Analysis of Concentration Distribution of Oxygen Defects

Figure 18:
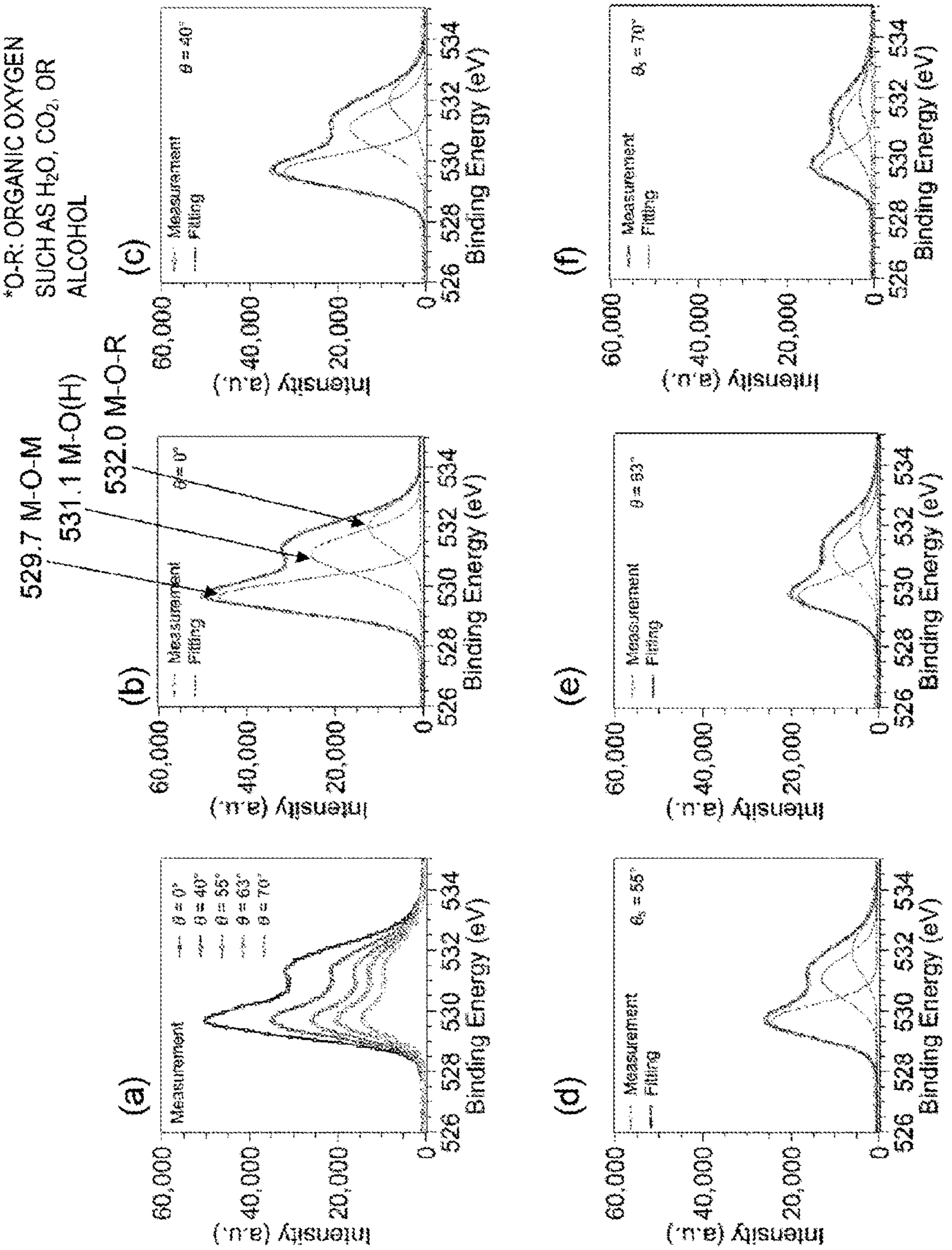
FIG. 18 illustrates measurement results of angle-resolved XPS of O1s.

FIG. 18 shows the measurement results of the angle-resolved XPS of O1s of the AOS layer (IZO film) fabricated by the same method as in Example 1. FIG. 18(*a*) is a graph showing a summary of measured spectra of O1s of the AOS layer when the inclination angle θ is set to 0°, 40°, 55°, 63°, and 70°. FIGS. 18(*b*) to 18(*f*) illustrate graphs obtained by decomposing the measurement spectra measured at the inclination angles θ of 0°, 40°, 55°, 63°, and 70° and fitting into M-O-M having a peak at 529.7 eV, M-O(H) having a peak at 531.1 eV, and M-O-R having a peak at 532.0 eV.

M refers to In or Zn. M-O-M means oxygen bridging between metal centers and means an oxide of a stoichiometric composition having no oxygen defect. M-O (H) means oxygen or a hydroxyl group having an unpaired electron that does not bridge between metal centers M-O-R means oxygen in an organic material such as $H_2O$, $CO_2$, or alcohol bonded to a metal center, and means compositions each having oxygen defects.

Figure 19:
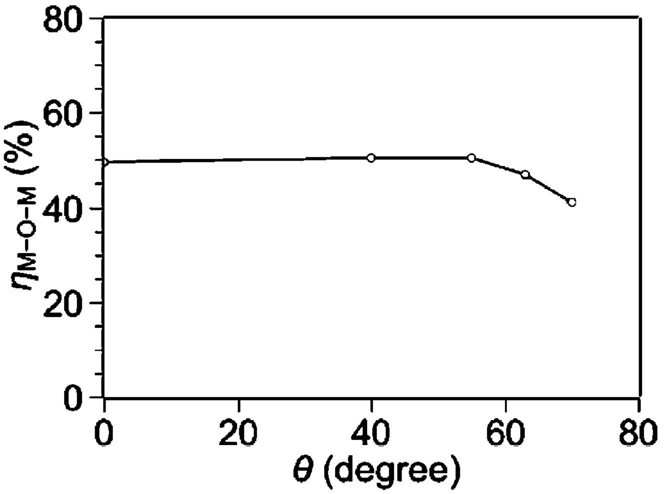
FIG. 19 is a graph showing angle dependence of a ratio ($\eta_{M\text{-}O\text{-}M}$) of M-O-M (in a metal oxide state) to the entire O1s.
Figure 22:
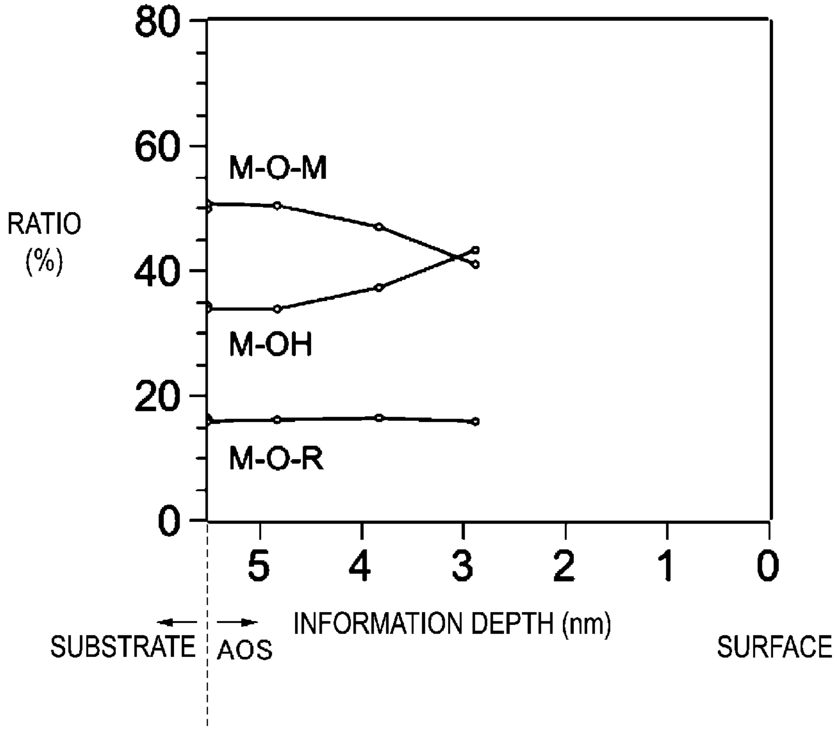
FIG. 22 is a graph showing thickness dependence of a ratio of each bonding species to the entire O1s on the thickness of the AOS film from the substrate toward the outermost surface.

FIGS. 19 and 22 and Table 1 show an angle dependence of the ratio ($\eta_{M\text{-}O\text{-}M}$) of M-O-M (in a metal oxide state) to the entire O1s calculated by the above fitting.

TABLE 1

Table 1

| INCLINATION ANGLE θ (°) | $\eta_{M\text{-}O\text{-}M}$ (%) | REDUCTION RATE OF $\eta_{M\text{-}O\text{-}M}$ (%) | INFORMATION DEPTH (nm) |
|---|---|---|---|
| 0 | 50 | 0 | 5.5 |
| 40 | 50 | 0 | 5.5 |
| 55 | 50 | 0 | 4.8 |

TABLE 1-continued

Table 1

| INCLINATION ANGLE θ (°) | $\eta_{M\text{-}O\text{-}M}$ (%) | REDUCTION RATE OF $\eta_{M\text{-}O\text{-}M}$ (%) | INFORMATION DEPTH (nm) |
|---|---|---|---|
| 63 | 46 | 4 | 3.8 |
| 70 | 41 | 9 | 2.9 |

The larger the inclination angle θ, the more the surface selective, and thus the composition closer to the surface of the AOS layer is represented. The ratio of the M-O-M bond was constant at about 50% in the inside of the AOS film, but the closer to the surface of the AOS film, the smaller the ratio of the M-O-M bond, and the ratio was decreased to about 40%, that is, the ratio of the M-O-M bond was decreased by about 20%. As described above, it was found that the AOS layer had more oxygen defects near the surface than in the inside and had a non-uniform chemical composition in the film thickness direction. In FIG. 22, each of three points at 5.5 nm on the horizontal axis is a ratio of an integrated value of a respective one of M-O species from the AOS outermost surface to the depth of 5.5 nm, and each of three points at 2.8 nm is a ratio of the integrated value of a respective one of the M-O species from the outermost surface to the depth of 2.8 nm.

Characteristic Evaluation after Long-Term Standing

Figure 23:
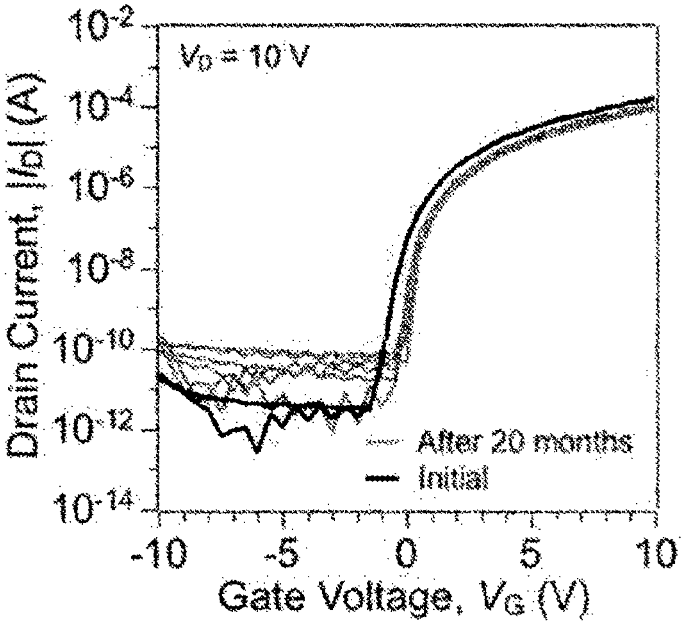
FIG. 23 is a graph showing evaluations of initial characteristics measured immediately after the fabrication of the TFT fabricated in the example and characteristics after being left under air atmosphere for 20 months.

FIG. 23 shows a graph evaluating the TFT device having W/L=200 μm/10 μm fabricated in Example 2 for initial characteristics measured immediately after the fabrication and characteristics after being left under air atmosphere for 20 months. Slight change was observed after standing for 20 months, but in the initial characteristics and after standing for 20 months, substantially the same characteristics were indicated, and thus it was found that the device had good long-term stability.

REFERENCE SIGNS LIST

100 Sealing material
10 Polymer layer
12 First polymer layer
14 Second polymer layer
20 Inorganic oxide insulator layer
30 Compound layer having a non-stoichiometric composition

The invention claimed is:

1. A sealing material for a compound having a non-stoichiometric composition, the sealing material comprising:

a polymer layer configured to be located on a side of the compound; and an inorganic oxide insulator layer on a side of the polymer layer opposite to the compound, wherein the polymer layer includes a first polymer layer containing an organic solvent soluble polymer, the polymer layer further includes a second polymer layer located between the first polymer layer and the inorganic oxide insulator layer, the second polymer layer includes a chemical vapor deposition film and a total thickness of the first polymer layer, the second polymer layer, and the inorganic oxide insulator layer is 100 nm or less.

2. The sealing material according to claim 1, wherein the organic solvent soluble polymer is an acrylic polymer, a styrenic polymer, a fluorine-based polymer, a thermally crosslinkable polymer, or a combination thereof.

3. The sealing material according to claim 2, wherein an inorganic oxide insulator of the inorganic oxide insulator layer is AlOx, HfOx, ZrOx, SiOx, TiOx, or a combination thereof.

4. The sealing material according to claim 2, wherein the chemical vapor deposition film is parylene.

5. The sealing material according to claim 1, wherein an inorganic oxide insulator of the inorganic oxide insulator layer is AlOx, HfOx, ZrOx, SiOx, TiOx, or a combination thereof.

6. The sealing material according to claim 5, wherein the chemical vapor deposition film is parylene.

7. The sealing material according to claim 1, wherein the chemical vapor deposition film is parylene.

8. The sealing material according to claim 1, wherein the compound having a non-stoichiometric composition is an amorphous metal oxide inorganic semiconductor film.

9. The sealing material according to claim 8, wherein the amorphous metal oxide inorganic semiconductor film has different distribution of oxygen deficiency state in a direction perpendicular to a main surface of the film, and includes a surface and an inside, the surface including more oxygen deficiency than the inside.

10. An electronic element comprising:
the sealing material described in claim 1.

11. A method for manufacturing the sealing material for a compound having a non-stoichiometric composition according to claim 1, the method comprising:
providing a substrate;
preparing an organic solvent containing a first polymer dissolved;
forming the polymer layer including the first polymer layer on the substrate by applying the organic solvent containing the first polymer dissolved; and
forming the inorganic oxide insulator layer on the polymer layer by using an atomic layer deposition method or a sputtering method to obtain the sealing material.

12. The method for manufacturing the sealing material according to claim 11, wherein
the forming the polymer layer includes forming the second polymer layer, which is a chemical vapor deposition film, on the first polymer layer by using a chemical vapor deposition method, and
the forming the inorganic oxide insulator layer includes forming the inorganic oxide insulator layer on the second polymer layer.

* * * * *